United States Patent
Eckert

(12) 
(10) Patent No.: US 6,232,760 B1
(45) Date of Patent: *May 15, 2001

(54) METHOD FOR DETERMINING AND COMPENSATING THE TRANSMISSION FUNCTION OF A MEASUREMENT APPARATUS, IN PARTICULAR OF A SPECTRUM ANALYZER

(75) Inventor: Hagen Eckert, Mering (DE)

(73) Assignee: Rohde & Schwarz GmbH & Co. KG, München (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,584

(22) Filed: Dec. 14, 1998

(30) Foreign Application Priority Data

Dec. 22, 1997 (DE) .............................................. 197 57 296

(51) Int. Cl.$^7$ ................................................... G01R 23/16
(52) U.S. Cl. ........................................ 324/76.19; 324/615
(58) Field of Search .................................... 324/601, 613, 324/638, 534, 76.19, 615; 703/13

(56) References Cited

U.S. PATENT DOCUMENTS

| | | | |
|---|---|---|---|
| 4,188,506 | * | 2/1980 | Schmid et al. ........................ 380/39 |
| 4,613,814 | * | 9/1986 | Penney .................................. 324/615 |
| 4,812,738 | * | 3/1989 | Itaya et al. ............................ 324/638 |
| 4,950,999 | * | 8/1990 | Agnello et al. ..................... 324/76.72 |
| 4,977,376 | * | 12/1990 | Schiek et al. ......................... 324/613 |
| 5,068,614 | * | 11/1991 | Fields et al. ......................... 324/534 |
| 5,179,344 | * | 1/1993 | Najile et al. ......................... 324/613 |
| 5,233,306 | * | 8/1993 | Misra .................................. 324/601 |
| 5,337,014 | * | 8/1994 | Najile ................................. 324/613 |
| 5,424,631 | * | 6/1995 | Ward ................................. 324/76.19 |
| 5,576,978 | * | 11/1996 | Kitayoshi ............................. 324/576 |

FOREIGN PATENT DOCUMENTS 0 437 034 B1    7/1991    (EP) .

OTHER PUBLICATIONS

Hewlett—Packard Journal, Manfred Bartz et al, Baseband Vector Signal Analyzer Hardware Design, pp. 31–59. Dec. 1993.

* cited by examiner

Primary Examiner—Safet Metjahic
Assistant Examiner—Vincent Q. Nguyen
(74) Attorney, Agent, or Firm—Schiff Hardin & Waite

(57) ABSTRACT

For determination of the transmission function of a measurement apparatus, in particular of a spectrum analyzer, a calibration signal, modulated with a modulation signed such that a line spectrum arises within the frequency band of interest is provided in the measurement apparatus. In a computer, the modulation signal is calculated from the digitized output signal of the measurement apparatus. The desired transmission function is then calculated therefrom according to magnitude and phase.

7 Claims, 1 Drawing Sheet

BLOCK DIAGRAM OF THE ADVANTAGEOUS REALIZATION

METHOD FOR DETERMINING AND COMPENSATING THE TRANSMISSION FUNCTION OF A MEASUREMENT APPARATUS, IN PARTICULAR OF A SPECTRUM ANALYZER

BACKGROUND OF THE INVENTION

The present invention relates to a method for determining and compensating a transmission function of a measurement apparatus, for example a spectrum analyzer or a vector analyzer.

Prior art methods of this type are disclosed in Hewlett Packard Journal, December 1993, p. 31 ff. or p. 47 ff. For the evaluation, the characteristic of the modulation signal used at the input side, and its exact time relation to the calibration signal, must be known. In many applications, this precondition is not given, for example when such a method is to be used in a measurement apparatus in which a single frequency calibration oscillator and an arbitrary sweep oscillator that increases linearly with frequency are indeed already present, as is the case for example in a spectrum analyzer. Since, however, particularly in such electronic measurement apparatuses with band-limiting filters, amplifiers or frequency-converting mixers, the frequency response of the measurement apparatus is influenced by these modules, (thus introducing a certain error to the measurement result), the determination of the transmission function is of particular importance in such measurement apparatuses. This is because when the amplitude and phase frequency response of the measurement apparatus are known, this apparatus can easily be compensated by a digital evaluation unit, thereby increasing measurement precision.

SUMMARY OF THE INVENTION

It is an object of the present invention to provide a method for determining the transmission function of a measurement apparatus that can also be used in measurement apparatuses that already contain essential components for this purpose.

In general terms the present invention is a method for determining the transmission function of a digital measurement apparatus, in particular of a spectrum analyzer. A calibration signal of the measurement apparatus is modulated such that within the useful frequency bandwidth a line spectrum arises. In a computer, the digital output signal which is digitized by an A/O converter that arises at the output of the measurement apparatus is evaluated.

In the computer, the modulation signal of the calibration signal is calculated from the known carrier frequency and the known sampling frequency of the A/D converter. The desired transmission function is then calculated therefrom according to absolute value and phase.

Advantageous developments of the present invention are as follows.

The calibration signal is produced in the measurement apparatus by multiplication of a single frequency carrier signal with an auxiliary signal whose frequency increases or decreases in a linear fashion.

The apparatus further has a signal frequency calibration oscillator and a sweep oscillator whose frequency increases or decreases in linear fashion. Before the circuit part whose transmission function is to be determined, the carrier signal of the calibration oscillator is multiplied, using a mixer, with the signal of the sweep oscillator.

The digitized output signal of the measurement apparatus is digitized in an A/D converter with a known sampling frequency, and, in the computer, the start frequency and the climb, as well as the beginning and ending of the ramp function of the modulation signal, are calculated therefrom. From this, as well as from the known carrier frequency of the calibration oscillator, the transmission function of the measurement apparatus is calculated.

In the computer, the function inverse to the calculated transmission function is calculated, and the transmission function of the measurement apparatus is compensated therewith, during operation of the measurement apparatus.

Using the determined inverse function, analog signal processing stages of the measurement apparatus are equalized with electronic circuitry.

In the inventive method, no immediate knowledge of the modulation signal used as the calibration signal is required, because according to the present invention the modulation parameters are calculated immediately in the evaluation unit, from the digitized output signal of the measurement apparatus. For this purpose, only knowledge of the carrier frequency of the calibration oscillator present at the input side and the sampling frequency of the A/D converter are required. The start frequency of the modulation signal and its slope can be calculated immediately from the output signal. The inventive method is thus advantageous for all measurement apparatuses having a standard single frequency calibration oscillator, a corresponding sweep oscillator, and an associated mixer. From the digitized output frequency, the start frequency of the sweep oscillator and its slope, and the resulting transmission function, can be calculated. For the compensation, it is then necessary only to calculate the corresponding inverse function, and to use it to correct the measurement results during operation of the measurement apparatus. In the same way, a compensation by means of an electronic equalization of analog signal processing stages is of course also possible. As a modulation signal, a linear sweep oscillator is particularly suitable, but other signals are also suitable for this, for example a pseudo-noise sequence. It is essential that only by this structure is a line spectrum generated within the employed frequency band of the measurement apparatus in which the transmission function is to be determined. A sweep with a linearly increasing or, respectively, decreasing frequency has the advantage that the line spectrum is also uniform. Thus, the spectral lines have the same frequency spacing with the same power.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, (in the Figures, like reference numerals identify like elements):

DESCRIPTION OF THE PREFERRED EMBODIMENTS

Figure 1:
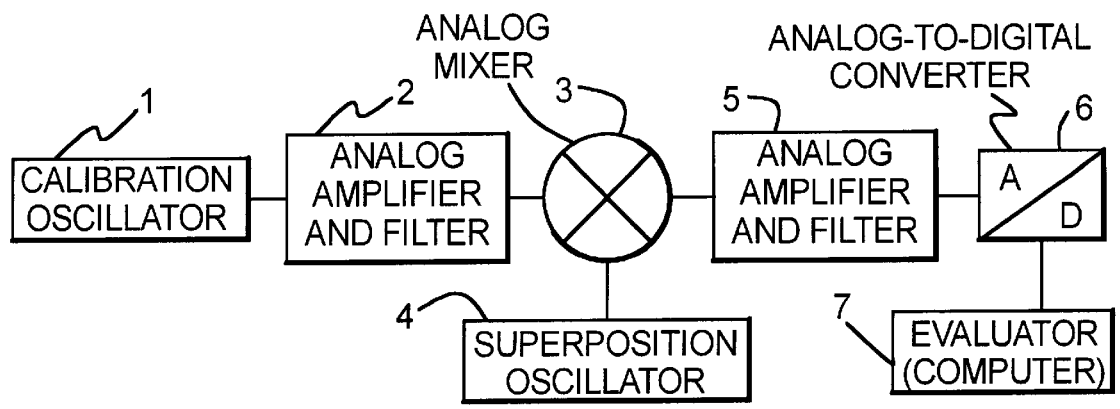
FIG. 1 shows the schematic diagram of an arrangement for executing the method of the invention, in a measurement apparatus here a spectrum analyzer.
Figure 2:
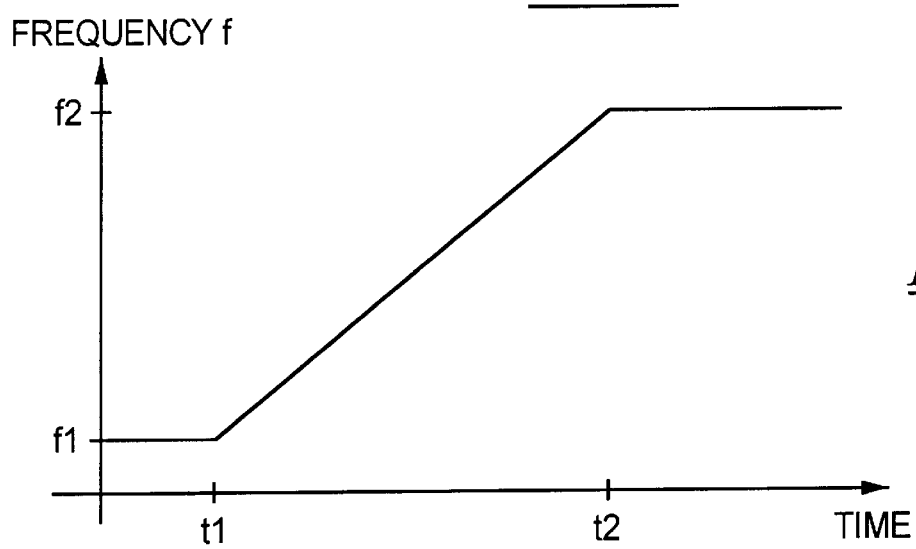
FIG. 2 shows the modulation frequency vs. time.

FIG. 1 shows the principle of the design for the execution of the method. A sinusoidal signal of a calibration oscillator 1, standard internally in every spectrum analyzer for level calibration, is provided in the input of the measurement apparatus 100. The following analog amplifier and filter stages 2 have only a negligible influence on the amplitude and phase frequency response. Subsequently, in the analog mixer 3 the signal is mixed (multiplied) with the signal of local or sweep oscillator 4. The frequency of the local oscillator 4 (sweep oscillator) is varied during the calibration process in a suitable manner (frequency or, phase modulation is provided by means of a suitable modulation signal) so that in the frequency domain a line spectrum arises whose frequency bandwidth has at least the desired calibration bandwidth. A suitable modulation signal is, for example, a ramp function, as used in standard spectrum analyzers for frequency sweeps. The frequency of the sweep oscillator 4 after modulation with such a ramp function is shown in FIG. 2.

After passing further analog filter and amplifier stages 5 of the measurement apparatus 100, whose overall frequency response is to be measured and compensated, the signal reaches an A/D converter 6 and is sampled there. An evaluation stage 7 at an output of the measurement apparatus 100 determines, in a digital computer, the correction parameters or, the inverse transmission function, and uses this to correct the amplitude and phase frequency response of the measurement apparatus 100.

FIG. 1 shows the application of the method, for example, in a spectrum analyzer or vector analyzer as the measurement apparatus 100. After passing the analog filter and amplifier stages 2 (which themselves make no significant contribution to the overall frequency response of the apparatus, and therefore are not compensated) the analog input signal g(t) of the form:

g(t)=a·cos(2π·$f_0$·t) of the single frequency calibration oscillator 1 is converted into the signal s(t) of the form s(t)=g(t)·h(t) in the multiplier 3, with an auxiliary signal h(t) of a sweep oscillator.

As an auxiliary signal h(t), where the real signal of the form:

h(t)=cos(2·π·∫($f_1$+$c_f$(t)·t)·dt) is used, with $$c_f(t) = \begin{cases} 0 & \text{for } 0 \leq t < t1 \\ c_f & \text{for } t1 \leq t < t2 \\ 0 & \text{for } t \geq t2 \end{cases};$$

h(t) describes a carrier signal that frequency sweeps, as can be produced by means of a synthesizer that is standard in spectrum analyzers.

The slope can be varied by means of the constant $c_f$(t). The starting frequency is determined by means of $f_1$.

As a frequency-time diagram, the signal can be represented by $$h(f) = \begin{cases} f_1 & \text{for } 0 \leq t < t_1 \\ f_1 + c_f \cdot (t - t_1) & \text{for } t_1 \leq t < t_2 \\ f2 = f_1 + c_f \cdot (t_2 - t_1) & \text{for } t \geq t_2 \end{cases};$$

(ramp signal according to FIG. 2).

The signal s(t) that arises in this way runs through further analog filter and amplifier stages 5 with the overall transmission function H(f), so that the signal a(t) of the form a(t)=[g(t)h(t)]*$F^{-1}${H(f)} results (convolution of the time signal with the inverse Fourier-transformed transmission function of the analog filter and amplifier stages).

The unwanted sideband of the mixing is suppressed by the transmission function {H(f)}, and is also of no interest for the further evaluation, so that the expression a(t) simplifies to:

a(t)=[$h_1$(t)]*$F^{-1}${H(f)} with $h_1$(t)=cos(2·π·∫($f_1$–$f_0$+$c_f$(t)·t)·dt);

or, respectively, in the frequency-time representation, $$h_1(f) = \begin{cases} f_1 - f_0 & \text{for } 0 \leq t < t_1 \\ f_1 - f_0 + c_f \cdot (t - t_1) & \text{for } t_1 \leq t < t_2 \\ f2 - f_0 = f_1 - f_0 + c_f \cdot (t_2 - t_1) & \text{for } t \geq t_2 \end{cases};$$

Subsequently, the signal a(t) is sampled in the analog-digital converter 6. The sampling frequency is selected so that Nyquist's criterion is fulfilled.

The signal, now digitized, is supplied to a standard digital computer 7 and is evaluated. The digital computer knows only the frequency $f_0$ and the sampling frequency of the A/D converter, and the computer calculates the transmission function H(f) to be compensated from the sampled signal a(t), without knowledge of the absolute time domain of the local oscillator signal and of the slope constant $c_f$(t). After determination of the transmission function G(f) inverse thereto, with the characteristic G(f)·H(f)=1 (for the calibration frequency range of interest), the magnitude of the frequency response and the phase frequency response of the measurement apparatus are corrected in the digital computer.

Figure 3:
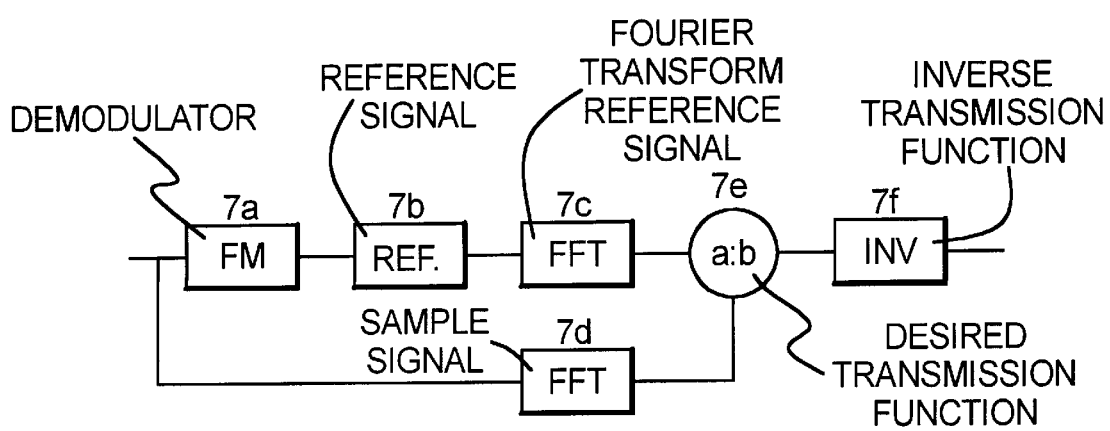
FIG. 3 shows details of the evaluation unit.

FIG. 3 shows the block switching diagram of a sample realization of the evaluation stage 7. The sampled and digitized signal is fed to a digital FM demodulator 7a. The magnitude of the frequency response value |H(f)| is suppressed by the FM demodulator 7a, so that the output signal $a_{fm}$(t) only contains components that are due to the phase frequency response of the apparatus.

The ideal ramp signal (FIG. 2) is a continuous function at times $t_1$ and $t_2$, but is not differentiable.

By means of a differentiation of the FM demodulator output signal, these differentiable portions of the ramp signal according to FIG. 2 are detected. For the leading and trailing transients of the ramp signal, the phase frequency response is not important, so that the frequencies $f_1$–$f_0$ in the time span 0 . . . $t_1$ or, respectively, $f_2$–$f_0$ can be calculated in the time span >$t_2$.

The times $t_1$ and $t_2$ and the two frequencies $f_1$ and $f_2$ are thereby determined, and the modulation constants $c_f$ are to be calculated via the relationship $$c_f = \frac{f_2 - f_1}{t_2 - t_1}.$$

With knowledge of the modulation parameters, the ideal reference signal 7b $h_{Ideal}$(t)=cos(2·π·∫($f_1$–$f_0$+$c_f$(t)·t)·dt is generated, and is subjected to a Fourier transformation 7c. By comparison of the Fourier transforms of the sampled signal 7d and the ideal reference signal 7c, the desired transmission function results as the quotient 7e of two complex spectra:

$$H(f) = \frac{F[[h_1(t)] * F^{-1}\{H(f)\}]}{F[h_{Ideal}(t)]}$$

The inverse transmission function required for the compensation of this frequency response is determined with the relationship G(f)·H(f)=1 in the function block 7f.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for determining a transmission function of a digital measurement apparatus, comprising the steps of:

at an input end within the measurement apparatus providing a calibration oscillator having a known carrier frequency which is modulated with a modulation signal to create a calibration signal to cause a line spectrum to arise within an employed frequency band within the measurement apparatus;

providing in the measurement apparatus an analog-to-digital converter which creates a digitized output signal at an output from the measurement apparatus; and in a computer connected at the output of the measurement apparatus calculating the modulation signal of the calibration signal from said known carrier frequency and a known sampling frequency of the analog-to-digital converter by use of a digital FM demodulator, calculating in the computer a start frequency and a slope, as well as a beginning time and ending time of the modulation signal by means of a differentiation of an output signal of the FM demodulator, and wherein calculating from said calculation as well as from the known carrier frequency of the calibration oscillator the transmission function of the measurement apparatus.

2. The method according to claim 1 wherein the calibration signal is generated by multiplication of a single frequency carrier signal with an auxiliary signal as said modulation signal whose frequency linearly changes.

3. The method according to claim 1 wherein the measurement apparatus has a single frequency calibration oscillator and a sweep oscillator whose frequency linearly changes, and wherein prior to a circuit part of the measurement apparatus whose transmission function is to be determined, a carrier signal of the calibration oscillator is multiplied by use of a mixer with a signal of the sweep oscillator.

4. The method according to claim 1 wherein in the computer, a function inverse to the calculated transmission function is calculated, and wherein the transmission function of the measurement apparatus is compensated using the inverse function during operation of the measurement apparatus.

5. The method according to claim 4 wherein using the inverse function, analog signal processing stages of the measurement apparatus are equalized by electronic devices.

6. A system for determining a transmission function of a digital measurement apparatus, comprising:

a digital measurement apparatus having a calibration oscillator having a known carrier frequency modulated with a modulation signal for creating a calibration signal which causes a line spectrum in an employed frequency band of the measurement apparatus, said measuring apparatus also having an analog-to-digital converter for creating a digitized output signal at an output from said measurement apparatus, said analog-to-digital converter having a known sampling frequency;

a digital FM demodulator; and a computer connected to the digitized output of the measurement apparatus for calculating the modulation signal of the calibration signal from said known carrier frequency and said known sampling frequency of the analog-to-digital converter by use of the digital FM demodulator, said computer calculating a start frequency and a slope, as well as a beginning time and ending time of the modulation signal by means of a differentiation of the FM demodulator output signal, and wherein from said calculation as well as from the known carrier frequency of said calibration oscillator the transmission function of the measurement apparatus is calculated.

7. The system of claim 6 wherein the transmission function is according to magnitude and phase.

* * * * *